(12) United States Patent
Ishikawa et al.

(10) Patent No.: US 8,366,325 B2
(45) Date of Patent: Feb. 5, 2013

(54) OPTICAL MODULE AND METHOD OF MANUFACTURING THEREOF

(75) Inventors: Yozo Ishikawa, Tokyo (JP); Hideyuki Nasu, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 342 days.

(21) Appl. No.: 12/352,846

(22) Filed: Jan. 13, 2009

(65) Prior Publication Data

US 2009/0269006 A1  Oct. 29, 2009

(30) Foreign Application Priority Data

Jan. 16, 2008  (JP) .................................. 2008-007441

(51) Int. Cl.
G02B 6/36 (2006.01)
(52) U.S. Cl. .......................................... 385/53; 385/89
(58) Field of Classification Search ..................... 385/53, 385/89
See application file for complete search history.

(56) References Cited

U.S. PATENT DOCUMENTS

| | | | |
|---|---|---|---|
| 6,394,666 B1 * | 5/2002 | Minamino et al. | 385/90 |
| 6,599,032 B1 * | 7/2003 | Kurashima et al. | 385/89 |
| 6,635,866 B2 * | 10/2003 | Chan et al. | 250/239 |
| 6,641,310 B2 * | 11/2003 | Williams | 385/92 |
| 6,736,553 B1 * | 5/2004 | Stiehl et al. | 385/89 |
| 6,748,145 B2 | 6/2004 | Border et al. | |
| 6,910,812 B2 * | 6/2005 | Pommer et al. | 385/92 |
| 6,950,570 B1 * | 9/2005 | Novotny | 385/18 |
| 2003/0053767 A1 * | 3/2003 | Cheng et al. | 385/89 |
| 2003/0118290 A1 | 6/2003 | Border et al. | |

(Continued)

FOREIGN PATENT DOCUMENTS

| | | |
|---|---|---|
| JP | 2000-199837 | 7/2000 |
| JP | 2002-202440 | 7/2002 |

(Continued)

OTHER PUBLICATIONS

Toshiyuki Okayasu, "High-density Interconnection in Memory Test System" Second Silicon Analog RF Research Conference, Aug. 2, 2004, 33 pages.

(Continued)

Primary Examiner — K. Cyrus Kianni
Assistant Examiner — Kaveh Kianni
(74) Attorney, Agent, or Firm — Oblon, Spivak, McClelland, Maier & Neustadt, L.L.P.

(57) ABSTRACT

An optical module 10 according to the invention is comprised of: a substrate 11; a laser diode array 14 implemented on said substrate in an array; a driver IC 15 implemented on said substrate and electrically connected to each of surface emitting semiconductor laser elements of the laser diode array 14; an optical connector unit 12 for holding a plurality of optical fiber 16 in an array, wherein the optical connector unit 12 is fixed to the substrate 11 in a location where center of each single end of said plurality of optical fiber and center of each light injecting region are aligned with each other; and a cover 13. The optical connector unit 12 includes two guide-pin holes 12b on two opposite sides of a plurality of fiber holding hole 12a. Two alignment marks 50 are provided on a surface 11a of the substrate 11, which are visually recognizable through each of the guide-pin holes 12b, and function as alignment reference of said optical connector unit 12.

9 Claims, 10 Drawing Sheets

U.S. PATENT DOCUMENTS

| | | | |
|---|---|---|---|
| 2003/0201462 A1* | 10/2003 | Pommer et al. | 257/200 |
| 2004/0120659 A1* | 6/2004 | Cheng et al. | 385/89 |
| 2004/0190851 A1* | 9/2004 | Garner et al. | 385/137 |
| 2010/0074581 A1* | 3/2010 | Tanobe et al. | 385/93 |

FOREIGN PATENT DOCUMENTS

| | | |
|---|---|---|
| JP | 2002-261372 | 9/2002 |
| JP | 2003-200278 | 7/2003 |
| JP | 2007-079090 | 3/2007 |

OTHER PUBLICATIONS

U.S. Appl. No. 12/863,194, filed Jul. 16, 2010, Nasu et al.

Office Action dated Nov. 16, 2009 issued in Japanese Patent Application No. 2008-007441.

* cited by examiner

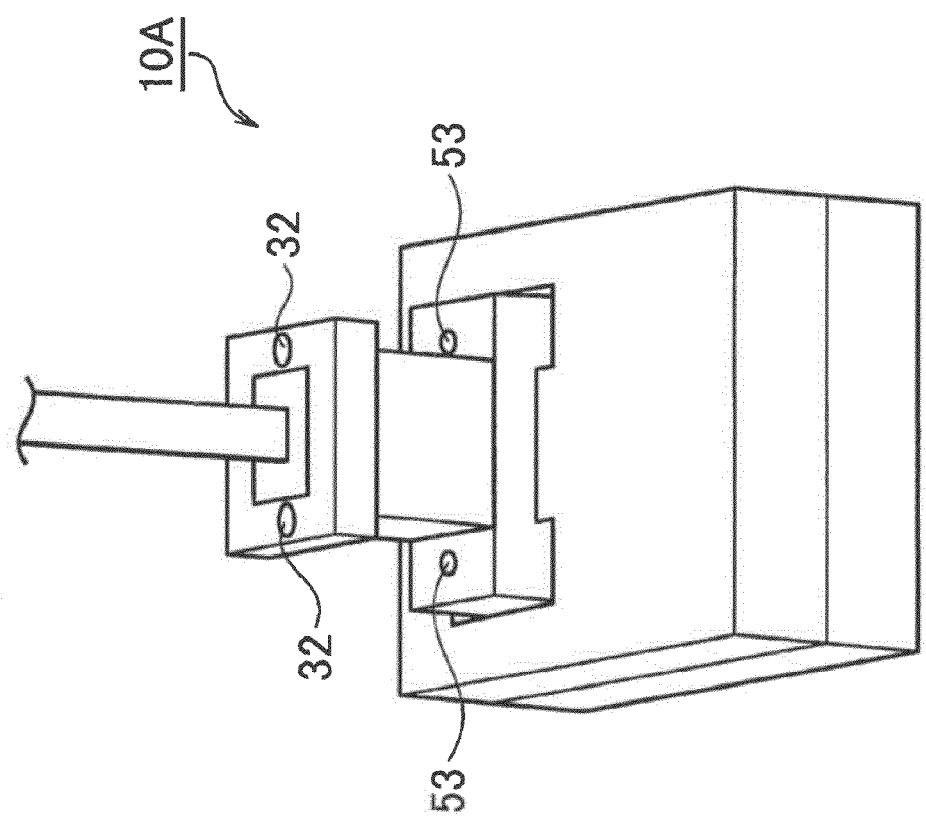

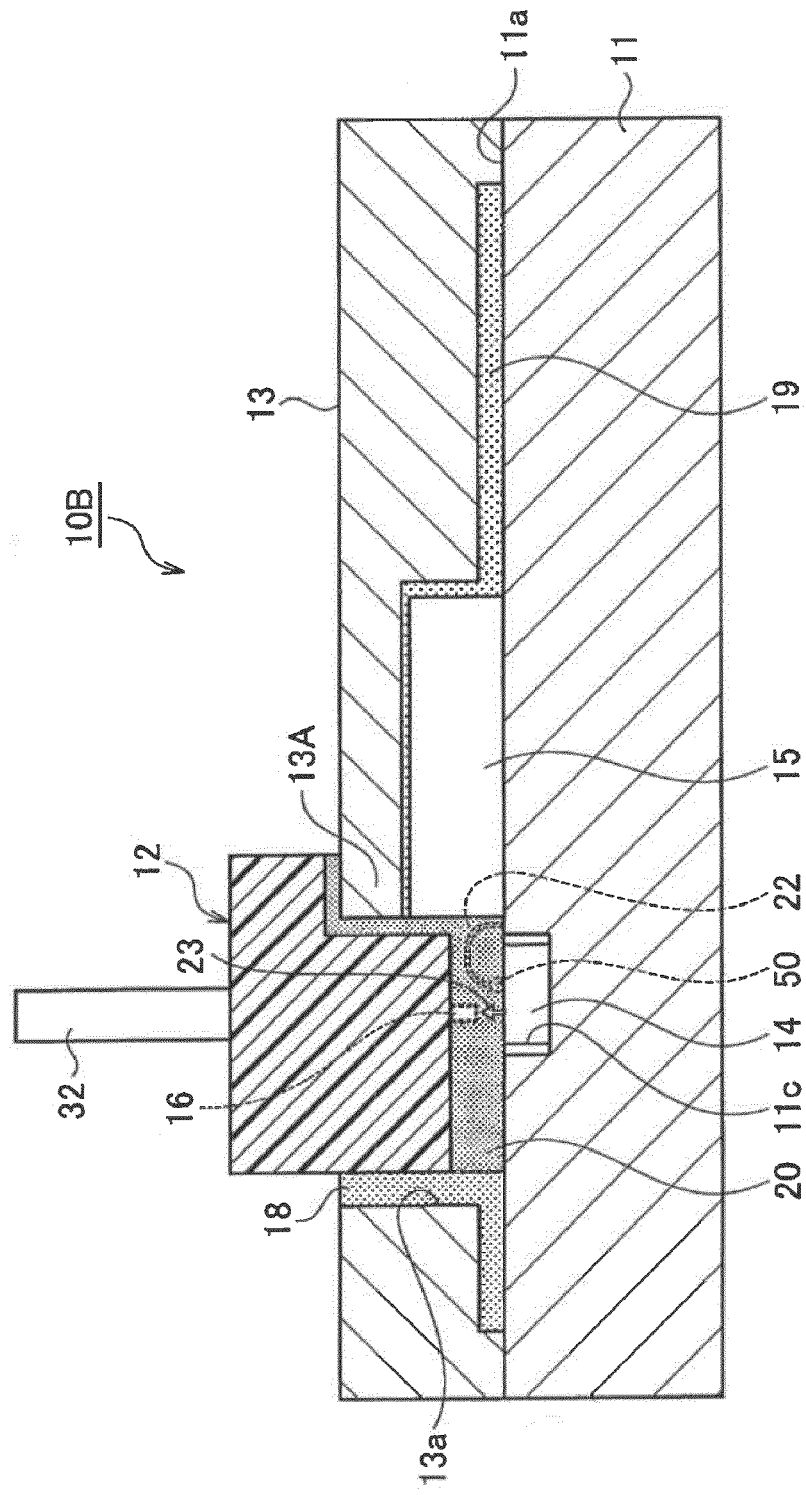

OPTICAL MODULE AND METHOD OF MANUFACTURING THEREOF

BACKGROUND OF THE INVENTION

1. Technical Field

The present invention is related to an optical module, in particular, to an optical module and a method for manufacturing thereof used in systems such as an optical transmission system between boards and optical transmission systems between equipments (between housings) and pertains to an optical module which is a parallel optical module that transmits optical signal in parallel using a plurality of optical fibers (a plurality of channel) allocated in an array.

2. Related Arts

In the prior art, a published Japanese Patent Application JP2002-261372 A1 (hereinafter referred to as "Document 1") discloses an optical module wherein a plurality of light emitting element and an electronic semiconductor chip (IC) that drives the plurality of optical elements are housed and integrated inside a case.

The following Document 2 discloses an optical module wherein a plurality of laser diode or a plurality of photodiode, and an IC (a driver IC that drives each laser diode or an amplification IC that controls an output of each photodiode) are housed and integrated inside a case.

Document 2: "High-density Interconnection in the Memory Test System", Toshiyuki Okayasu, Second Silicon Analog RF Research Conference, Aug. 2, 2004

However, in prior art optical modules disclosed in the above Documents 1 and 2, each single end of a plurality of optical fibers maintained in ferrules and each light injecting region or light receiving region of a plurality of optical elements are aligned by a passive-active alignment that employs silicon optical bench (SiOB). Therefore, there was a need to set up a SiOB inside the optical module so as to implement the passive alignment while problem arose because of the optical module getting larger in size with increase in the number of parts.

BRIEF SUMMARY OF THE INVENTION

The present invention is achieved in view of problems in the prior art, and the object of present invention is to provide an optical module and a method for manufacturing an optical module that can achieve reduction in the number of parts and reduction in size while carrying out active alignment in a short time.

In order to solve the above-described problems, an optical module according to claim 1 of the invention comprises: a substrate; a plurality of optical elements implemented on said substrate; an electronic element implemented on said substrate and electrically connected to said plurality of optical elements; an optical connector unit for holding a plurality of optical fibers, wherein the optical connector unit is fixed to said substrate in a location where said plurality of optical fibers and said plurality of optical elements are optically coupled with each other; and a cover including an opening for attaching said optical connector, wherein the cover is fixed to said substrate so that the cover covers all of elements including said plurality of optical elements and said electronic element; and wherein said optical connector includes a plurality of fiber holding hole in which said plurality of optical fibers is inserted and held, and two through-holes which are located on two opposite sides of said plurality of fiber holding hole and whose center is aligned to center of said plurality of fiber holding hole; and two alignment marks are provided on a surface of said substrate, which are visually recognizable through each of said two through-holes, and which function as alignment references of said optical connector.

According to such an arrangement, provisional-positioning of the optical connector unit can be accomplished by moving the optical connector unit in two-dimension on the substrate so that the alignment mark is visually recognizable through two through-holes of the connector unit in the center of each through-hole. Consequently, only a small movement of the optical connector unit is needed during active alignment which is performed after carrying out the provisional-positioning, active alignment can be performed within a short time. Moreover, reduction in the number of parts and reduction in size can be achieved without the need for providing silicon optical bench (SiOB) inside for carrying out passive alignment as in prior art.

In this regard, "a location where a plurality of optical fibers and a plurality of optical elements optically couple with each other", is a location where core center of each optical fiber and center of light injecting region or light receiving region of each optical fiber align with each other.

The optical module according to claim 2 of the invention is characterized in that: said optical connector unit is capable of moving in two-dimension on said surface for performing active alignment that adjusts a position of said optical connector unit so that each of the plurality of optical fibers and each of the plurality of optical elements are optically coupled.

According to such an arrangement, after provisional-positioning of the optical fiber connector unit is done, position of the optical connector can be adjusted at a location where a plurality of optical fibers and said plurality of optical elements optically couple with each other, by carrying out active alignment.

In this regard, "active alignment" is done by incidenting light into each of a plurality of optical fibers and moving the optical connector unit in two-dimension on the substrate so that optical intensity of light injected from each optical fiber becomes the greatest. For instance, in case the optical element is a surface emitting semiconductor laser, it is done by driving a plurality of surface emitting semiconductor laser element using a driver IC that is an electronic element, incidenting the light injected from each of the surface emitting semiconductor laser element into a plurality of optical fibers of the optical connector unit, receiving the light injected from each optical fiber at the plurality of photodiode, and moving the optical connector unit in two-dimension on the substrate so that the output signal of each photodiode becomes the greatest.

The optical module according to claim 3 of the invention is characterized in that: said two through-holes of said optical connector unit are two guide-pin holes in which two guide-pins fit in respectively.

According to such an arrangement, since the provisional-positioning of the optical connector unit is carried out by using two guide-pin holes of the optical connector unit where the guide-pins fit in as through-holes for visually recognizing alignment marks, there is no need to work on special processes for the optical connector unit having two guide-pin holes.

The optical module according to claim 4 of the invention is characterized in that: said optical connector unit includes two guide-pin holes in which two guide-pins fit in respectively, and said two through-holes are through-holes for alignment that are aligned their center with center of said two guide-pin holes at outer side of said two guide-pin holes.

According to such an arrangement, under conditions wherein the ferrule type connectors are attached in the optical connector unit, provisional-positioning of the optical connector unit can be done by moving the optical connector unit in two-dimension on the substrate so that alignment marks are visually recognizable through the two through-holes for alignment at the center of each through-hole. Therefore, active alignment to be carried out following provisional-positioning can be achieved by passing light respectively through multi-core optical fibers held by the ferrule type connector.

The optical module according to claim 5 of the invention is characterized in that: resin sealant or adhesive agent is filled in a gap between an opening of said cover and said optical connector unit.

According to such an arrangement, after performing active alignment to each single end of a plurality of optical fibers and each light injecting region of a plurality of optical elements, either the inner part of the optical module can be sealed airtight using resin sealant, or the optical connector unit can be fixed on a cover using an adhesive.

The optical module according to claim 6 of the invention comprises: a plurality of surface emitting semiconductor laser element as said optical element; and a driver IC for driving said plurality of surface emitting semiconductor laser element as said electronic element; and wherein the optical module is configured as a transmitting optical module that transmits optical signal injected from said plurality of surface emitting semiconductor laser element to outside via said plurality of optical fibers in parallel.

The optical module according to claim 7 of the invention comprises: a plurality of photodiode as said optical element; and an amplifying IC that has a function of amplifying output current of said photodiode by converting into voltage; and wherein the optical module is configured as a receiving optical module that receives at said plurality of photodiode, optical signal transmitted in parallel from outside via said plurality of optical fibers and converts to electric signal.

In order to solve the above-described problems, a method for manufacturing an optical module according to claim 8 of the invention, comprises: implementing a plurality of optical elements in an array and an electronic element on a substrate and electrically connecting the plurality of optical elements and the electronic element; placing an optical connector unit that holds the plurality of optical fibers onto the substrate; fixing a cover that has an opening for attaching the optical connector unit; provisional-positioning the optical connector unit by moving the optical connector unit in two-dimension on the substrate so that alignment marks provided on the substrate at the center of each of two through-holes are visually recognizable through the two through-holes provided at the optical connector unit; after said provisional-positioning of the optical fiber connector unit, performing active alignment for adjusting the optical connector unit at a location where said plurality of optical fibers and said plurality of optical elements optically couple with each other respectively; and after performing said active alignment, fixing the optical connector unit onto the substrate.

According to such a method, provisional-positioning of the optical connector unit can be done by moving the optical connector unit in two-dimension on the substrate so that alignment marks are visually recognizable through the two holes of the optical connector unit at the center of each through-hole. Consequently, only a small movement of the optical connector is needed during active alignment following the provisional-positioning, active alignment can be performed within a short time. Furthermore, reduction in the number of the parts and reduction in size can be achieved without the need for having to set up silicon optical bench (SiOB) inside in order to carry out passive alignment as in the case of prior art.

The method for manufacturing an optical module according to claim 8 of the invention is characterized in that: said provisional-positioning of the optical connector unit includes: imaging each end of said two through-holes by a camera that has its optical axis aligned with center axis of said through-hole; acquiring image information for inside of each of the through-holes; and displaying an image for said inside of each of the through-holes based on said image information.

According to such a method, provisional-positioning of the optical connector unit can be accomplished quite easily and efficiently since the optical connector unit can move in two-dimension on the substrate so that alignment marks are visually recognizable at the center of each through-hole, while also seeing the image of the inner side of each through-hole as displayed with a display means.

According to the present invention, together with achieving active alignment within a short time it also becomes possible to accomplish an optical module that is reduced in number of parts and size.

BRIEF DESCRIPTION OF THE DRAWINGS

The above and other objects and features of the invention will appear more fully hereinafter from a consideration of the following description taken into connection with the accompanying drawing wherein one example is illustrated by way of example.

FIG. 8 is a perspective view showing a condition wherein an external connector is installed on the optical connector unit of the optical module according to the second embodiment of the invention.

FIG. 10 is a cross-sectional view showing a schematic arrangement of the optical module according to the third embodiment of the invention.

DETAILED DESCRIPTION OF THE INVENTION

Figure 1:
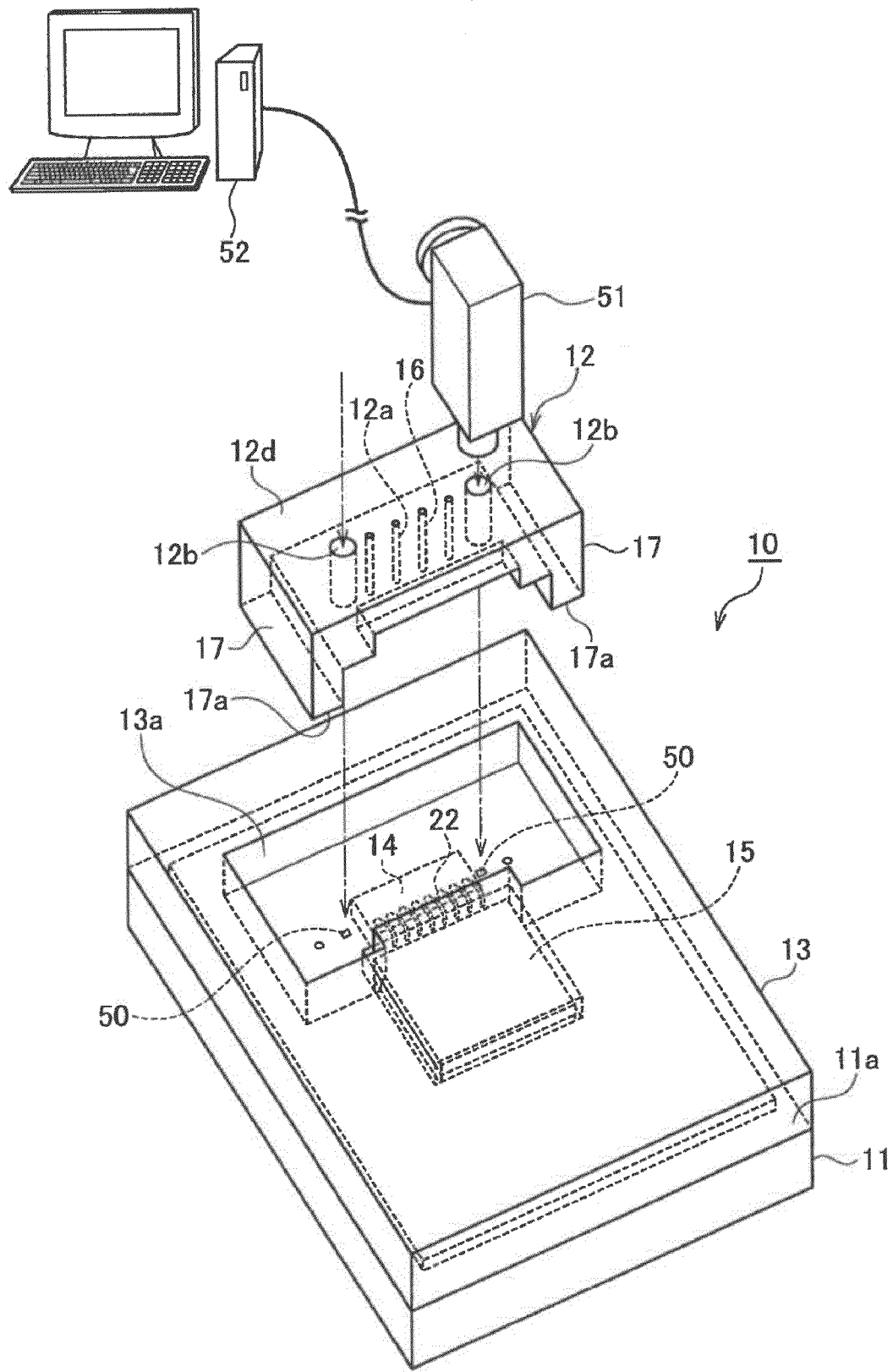
FIG. 1 is a disassembled perspective view showing a schematic arrangement of an optical module according to a first embodiment of the invention.

In the following, embodiments of the invention will be described referring to the drawings. Upon describing each embodiment of the invention, duplication has been avoided by adding a similar symbol for a similar part.

First Embodiment

An optical module according to the first embodiment of the invention will be described referring to FIGS. 1-6.

Figure 2:
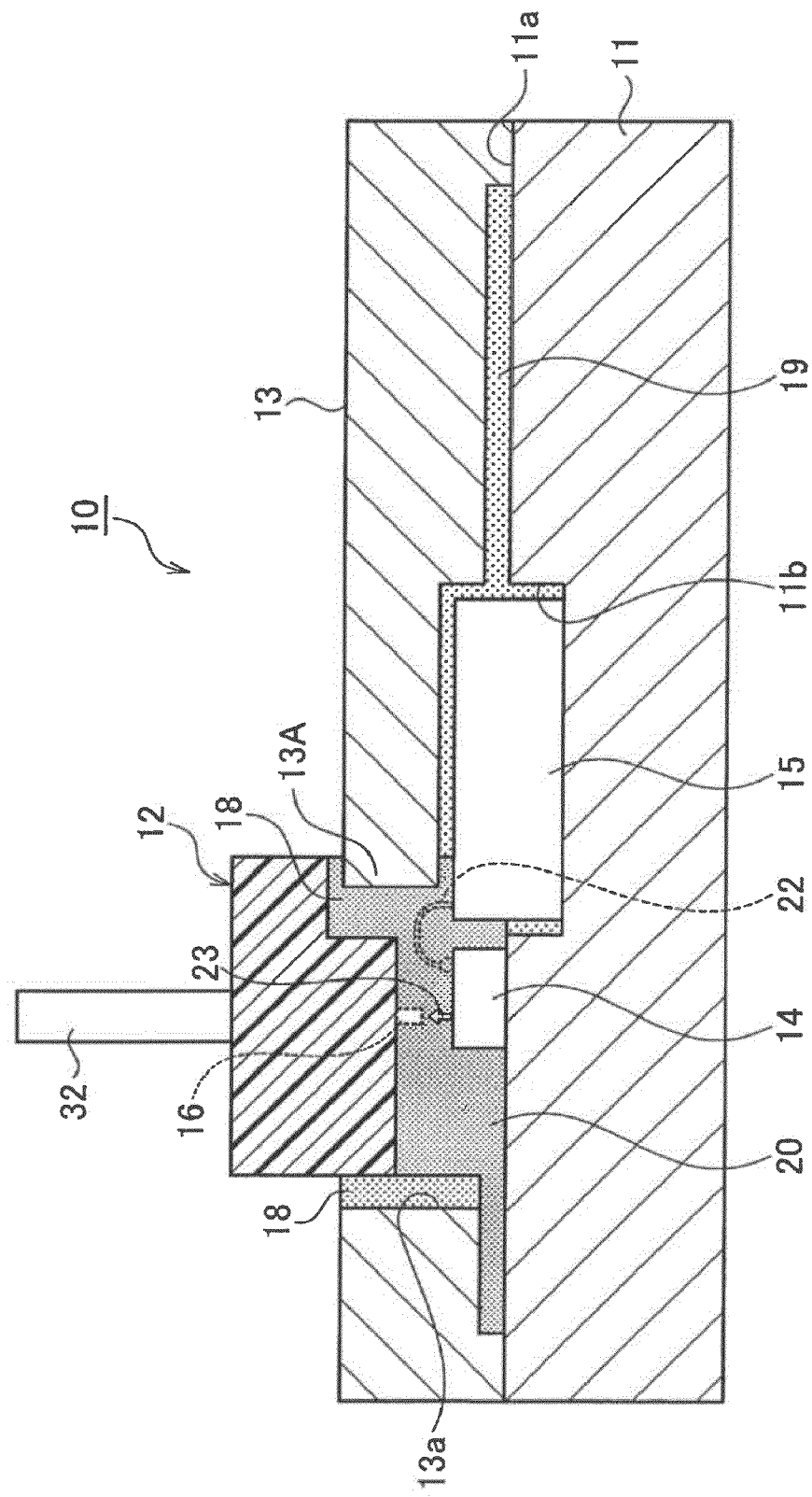
FIG. 2 is a cross-sectional view showing a schematic arrangement of the optical module according to the first embodiment of the invention.
Figure 3A:
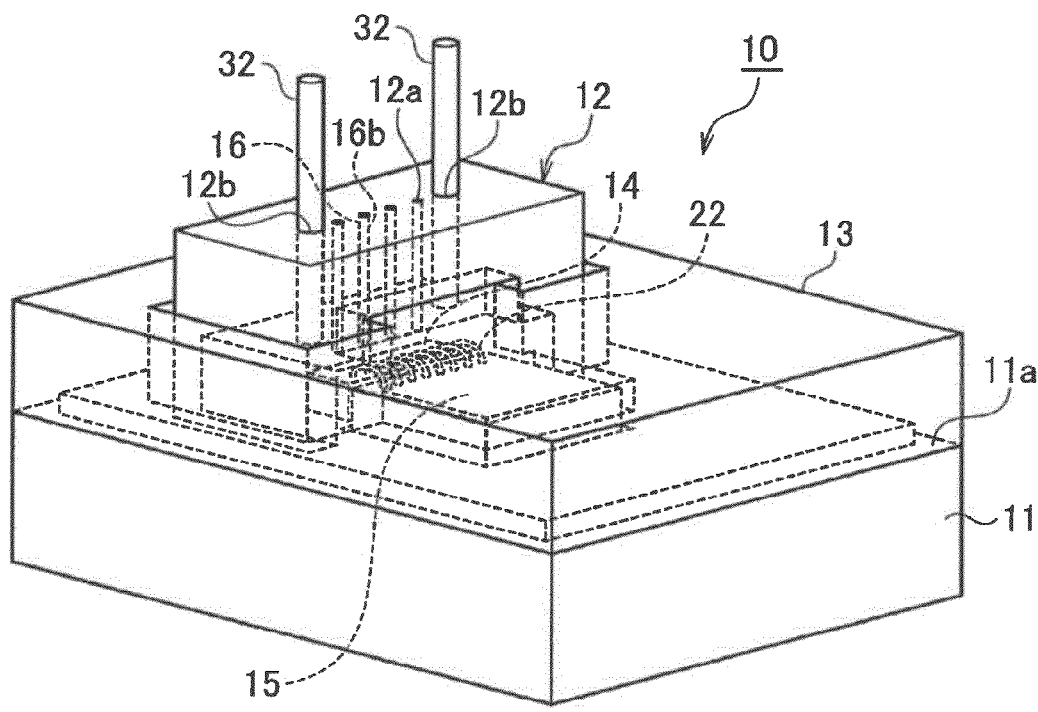
FIG. 3(A) is a perspective view showing an entire optical module.
Figure 3B:
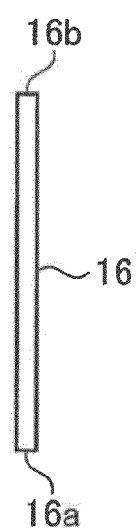
FIG. 3(B) is a magnified view of one optical fiber among a plurality of optical fibers used in the optical module.
Figure 3C:
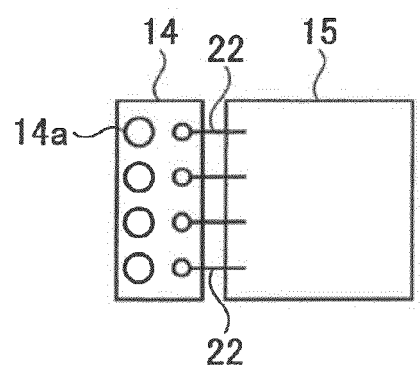
FIG. 3(C) is a top view showing a connective relationship of a laser diode array and a driver IC used in the optical module.
Figure 4:
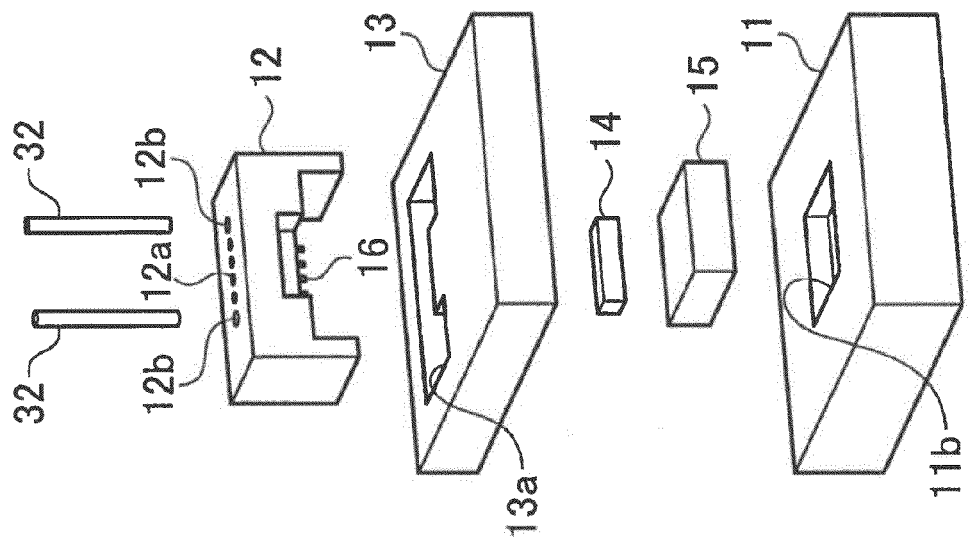
FIG. 4 is a perspective view showing a schematic arrangement of the optical module.
Figure 5:
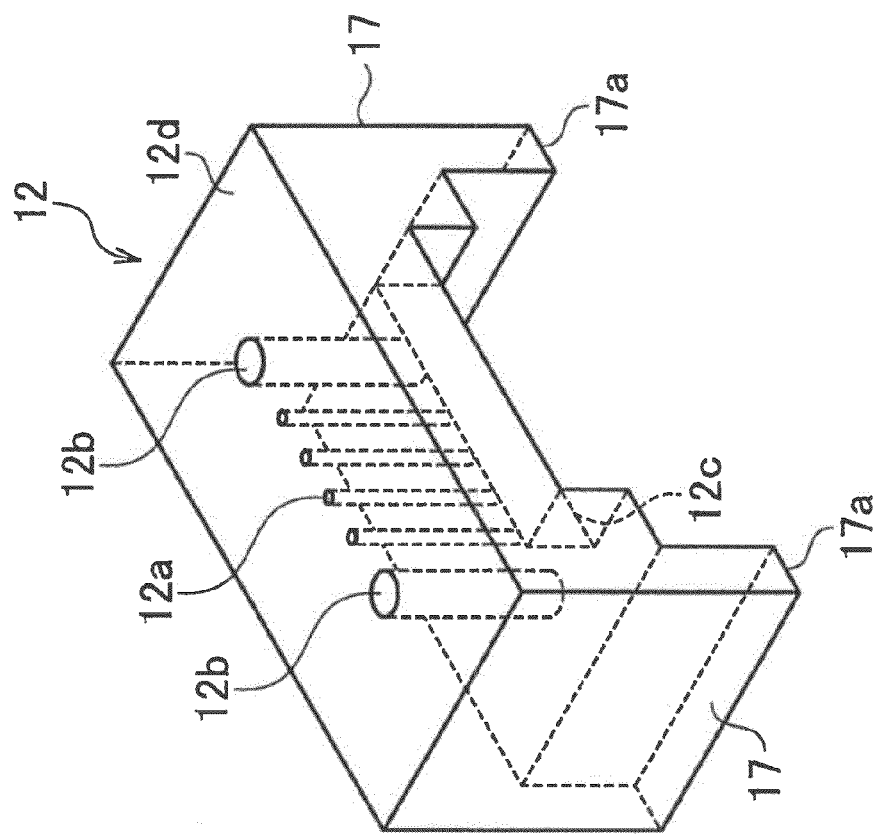
FIG. 5 is a perspective view showing an optical connector unit of the optical module.
Figure 6:
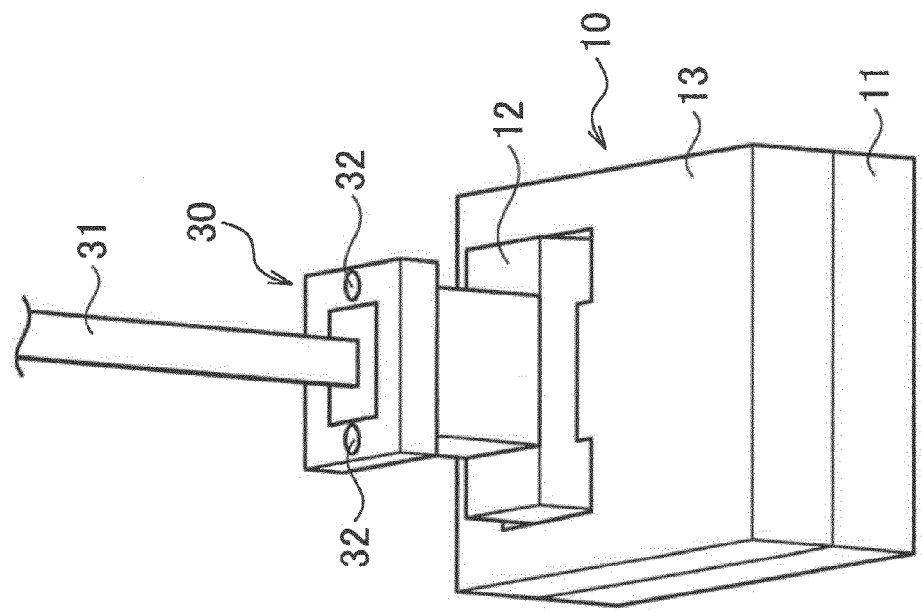
FIG. 6 is a perspective view showing a condition wherein an external connector is installed on the optical connector unit of the optical module according to the first embodiment of the invention.

FIG. 1 is a disassembled perspective view of a schematic arrangement of the optical module according to the first embodiment of the invention. FIG. 2 is a disassembled perspective view of a schematic arrangement of the optical module according to the second embodiment of the invention. FIG. 3(A) is a perspective view showing the entire optical module. FIG. 3(B) is a magnified view of one strand of a plurality of optical fibers used in that optical module. FIG. 3(C) is a top view showing connective relationship of a laser diode array and a driver IC used in the optical module. FIG. 4 is a perspective view showing a schematic arrangement of the optical module. FIG. 5 is a perspective view showing the optical module connector unit of the optical module. FIG. 6 is a perspective view showing a condition wherein an external connector is attached in the optical connector unit of the optical module.

As shown in FIG. 1, FIG. 2, FIG. 3(A) and FIG. 4, an optical module 10 according to the first embodiment of the invention comprises a substrate 11, an optical connector unit 12, a cover 13, and guide-pins 32. The substrate 11 is a ceramics substrate, and its surface 11a has an electrode pattern (not illustrated). A plurality of optical elements implemented by arranging in an array, and an electronic element electrically connected to the plurality of optical elements are provided on the electrode pattern of the substrate 11. In the present embodiment of the invention, the plurality of the optical elements is composed of a laser diode array 14 having a plurality of surface emitting semiconductor laser element (optical element) arranged in an array. A reference number 14a at FIG. 3(C) shows each light injecting region (opening region) of the plurality of surface emitting semiconductor laser element in the laser diode array 14. The surface emitting semiconductor laser element that functions as the optical element, is a VCSEL (Vertical Cavity Surface Emitting Laser) that injects light (light signal 23) in vertical direction from the surface of the substrate. Furthermore, the electronic element is a driver IC 15 that drives the plurality of surface emitting semiconductor laser element of the laser diode 14.

The laser diode array 14 and the driver IC 15 is implemented on the electrode pattern of the surface 11a of the substrate 11 by adhesive bonding with, for instance, die attach agent. As shown in FIGS. 3(A) and 3(C), a plurality of surface emitting semiconductor laser element of the laser diode array 14 and the driver IC 15 are respectively electrically connected using a plurality of wire 22. Therefore, modulating signal is input from the driver IC 15 into a plurality of surface emitting semiconductor laser element of the laser diode array 14 via the wires 22 so that an optical signal 23 modulated by the modulating signal is injected from each surface emitting semiconductor laser element. Moreover, the driver IC 15 and the electrode pattern of the substrate 11 are electrically connected with a plurality of wires (not illustrated).

As shown in FIG. 5, the optical connector unit 12 arranges a plurality of optical fibers 16 in an array and holds it (in perpendicular direction from the paper surface of FIG. 2). As regards the optical connector unit 12, after performing active alignment so as to align the center (core center) of each single end 16a of the plurality of optical fibers 16 with the center of each light injecting region 14a of the plurality of surface emitting semiconductor laser element of the laser diode array 14, it is fixed on the surface 11a of the substrate 11. As a result, the light (optical signal 23) injected form each surface emitting semiconductor laser element of the laser diode array 14, is optically coupled with a single end 16a of the corresponding optical fiber among the plurality of optical fibers 16.

Furthermore, the optical connector unit 12 has sidewalls 17 on both left and right sides. The bottom surface 17a (refer to FIG. 5) of two sidewalls 17 is slidably in contact with the surface 11a of the substrate 11. After performing active alignment by moving the optical connector unit 12 in the surface 11a of the substrate 11 in two-dimension so that center of each single end 16a of a plurality of optical fibers 16 is aligned with center of each light injecting region of the laser diode array 14, the bottom surface 17a of both sidewall 17 of the optical connector unit 12 is fixed on the surface 11a of the substrate 11 using adhesives, etc.

In addition, as shown in FIG. 5, the plurality of optical fibers 16 is inserted into the optical connector unit 12 and the optical connector unit 12 has a plurality of fiber holding hole 12a that has been arranged and held in an array, and two guide-pin holes 12b provided on two opposite sides of these fiber holding holes 12a. The two guide-pins 32 are respectively made to be able to fit into the two guide-pin holes 12b.

The two guide-pins 32 are respectively made to fit into two through-holes of the multi-core ferrule type connector 30 (hereinafter referred to as "MT connector") that functions as an external connector shown in FIG. 6. By fitting the two guide-pins 32 in the two through-holes of the MT connector 30, the MT connector 30 is installed at the optical connector unit 12, as shown in FIG. 6, under conditions wherein the center of each optical fiber of multi-core optical fiber (multi-core tape optical fiber) 31 maintained by the MT connector 30 is aligned with each center (core center) of a plurality of optical fibers 16 maintained by the optical connector unit 12.

As shown in FIG. 2 and FIG. 4, the cover 13 has an opening 13a for attaching the optical connector unit 12 and is fixed on the substrate 11 with adhesive, etc., so as to cover all of elements including the laser diode array 14, the driver IC 15, etc. This cover 13 is manufactured with alloys of materials having high thermal conductivity, such as Cu (Copper), W (Tungsten).

The characteristics of the optical module 10 will be described in the following:

As shown in FIG. 1 and FIG. 5, the optical connector unit 12 has the plurality of fiber holding holes 12a with the plurality of optical fibers 16 inserted and arranged in an array, and two through-holes with each center aligned with center of the plurality of fiber holding holes 12a at two opposite sides of the plurality of fiber holding holes 12a. In the present embodiment of the invention, the two through-holes are two guide-pin holes 12b in which two guide-pins 32 are fit in respectively.

As shown in FIG. 1 and FIG. 5, the two alignment marks 50 that are visually recognizable through each of the two guide-pin holes (through-holes) 12b and that function as a reference for determining the position of the optical connector unit are provided on the outer side of the laser diode array 14.

Moreover, as regards the optical module 10, the optical connector unit 12 is capable of moving in two-dimension on the surface 11a of the substrate 11 so as to perform active alignment for adjusting the position of the optical connector unit 12 in such a way as to optically couple each of the plurality of optical fibers 16 and the laser diode array 14. In other words, in order to carry out active alignment so as to align the center (core center) of each single end 16a of the plurality of optical fiber 16 and the center of each light injecting region 14a (refer to FIG. 3(C)) of laser diode array 14, the bottom surface 17a of both sidewalls 17 is made to slidably contact the surface 11a of the substrate 11 so as to be capable of moving in two-dimension on the substrate 11.

Furthermore, at an end surface 12c (refer to FIG. 5) facing the surface 11a of the substrate 11 of the optical connector unit 12, each single end 16a of the plurality of optical fibers 16 is arranged in an array, and is facing each light injecting region 14a of the laser diode array 14. At another end surface 12d opposite from the end surface 12c of the optical connector unit 12, each another end 16b of the plurality of optical fibers 16 is arranged in an array. As shown in FIG. 2, resin 18 consisting of resin sealant or adhesive agent, etc. is filled in a gap between the side surface of the optical connector unit 12 and the opening 13a of the cover 13.

Furthermore, as shown in FIG. 1 and FIG. 2, sealant with high thermal conductivity is filled in a gap (space) between the surface 11a of the substrate 11 and elements installed on this surface 11a, and the cover 13. Specifically, silicone gel 19 having thermal conductivity and insulation characteristics is filled as a sealant in a space between the cover 13 and the driver IC 15. Moreover, transparent silicone gel 20 is filled as a sealant in a space between single ends 16a of the plurality of optical fibers 16 and each light injecting region 14a of the laser diode array 14.

Method for Manufacturing an Optical Module

A method for manufacturing the optical module 10 arranged as described above will be described referring to FIG. 1.

The method for manufacturing the optical module 10 is comprised of the following steps (1)-(6):

(1) implementing the laser diode array 14 in an array and the driver IC 15, and electrically connecting the laser diode array 14 and the driver IC with the wire 22;

(2) placing the optical connector unit 12 that holds the plurality of optical fibers 16 in an array onto the surface 11a of the substrate 11;

(3) fixing a cover 13 that has an opening 13a for attaching the optical connector unit 12;

(4) provisional-positioning (rough positioning) the optical connector unit 12 by moving the optical connector unit 12 in two-dimension on the substrate 11 so that the alignment marks 50 provided on the substrate 11 at the center of each guide-pin hole 12b are visually recognizable through the two guide-pin holes (through-holes) provided at the optical connector unit 12;

(5) after the provisional-positioning of the optical connector unit 12, performing active alignment for adjusting the optical connector unit 12 at a location where a center of each single end 16a of the plurality of optical fibers 16 and a center of each light injecting region 14a align;

(6) after performing the active alignment, fixing the optical connector unit 12 onto the surface 11a of the substrate 11.

As shown in FIG. 1, in the above step (4) that performs provisional-positioning of the optical connector unit 12, it is preferable if each end of the two guide-pin holes 12b are imaged by a camera 51 that has optical axis of its lens aligned with center axis of the guide-pin hole 12b, image information for inside of each guide-pin hole 12b is acquired, and image inside each guide-pin hole 12b is displayed based on the image information by a display 52 that functions as a displaying means.

According to the first embodiment of the invention arranged as such, the present invention accomplishes following functions and advantageous effects: The provisional-positioning of the optical connector unit 12 is accomplished by moving the optical connector unit 12 in two-dimension on the substrate 11 so that the alignment marks 50 provided on the substrate 11 at the center of each guide-pin hole 12b are visually recognizable through the two guide-pin holes of the optical connector unit 12. Consequently, only a small movement of the optical connector 12 is needed during active alignment following the provisional-positioning, and the active alignment can be performed within a short time. Furthermore, reduction in the number of the parts and reduction in size can be achieved without the need for having to set up silicon optical bench (SiOB) inside in order to carry out passive alignment as in the case of prior art.

Therefore, together with achieving active alignment within a short time, it also becomes possible to accomplish an optical module 10 that is reduced in number of parts and size.

Since the optical connector unit 12 is movable in two-dimension on the substrate 11, active alignment can be performed after the provisional alignment of the optical connector unit 12 to adjust the location of the optical connector unit 12 so that center of each single end 16a of the plurality of optical fibers 16 and center of each light injecting region 14a respectively align.

Since the provisional-positioning of the optical connector unit 12 is carried out by using two guide-pin holes 12b of the optical connector unit 12 where the guide-pins 32 fit in as the through-holes for visually recognizing alignment marks 50, there is no need to work on special machinery processes for the optical connector unit 12 having two guide-pin holes 12b.

Resin 18 consisting of resin sealant or adhesive agent, etc. is filled in a gap between the opening 13a of the cover 13 and the optical connector unit 12. Therefore, after performing active alignment so that each single end of the plurality of optical fibers 16 and each light injecting region of the laser diode array 14 align, the inner part of the optical module can be sealed airtight, or the optical connector unit 12 can be fixed on a cover 13.

As shown in FIG. 1, in the above method for manufacturing an optical module, in the above step (4) that provisionally positions the optical connector unit 12, image information for inside of each guide-pin hole 12b is acquired, and image inside each guide-pin hole 12b is displayed based on the image information by a display 52. Accordingly, the optical connector unit 12 is able to move in two-dimension on the substrate 11 while looking into the image inside each guide-pin hole 12b displayed on the display 52 so that the alignment marks 50 are visually recognizable at the center of each guide-pin hole 12b. Therefore, the provisional alignment of the optical connector unit 12 can be done easily and effectively.

In the above step (4), since each end of the two guide-pin holes 12b are imaged by a camera 51 that has optical axis of its lens aligned with center axis of the guide-pin hole 12b and image information for inside of each guide-pin hole 12b is acquired, the image displayed on the display 52 will be an image in which each end of the two guide-pin holes 12b is looked into from a perpendicular direction. Therefore, the provisional alignment of the optical connector unit 12 can be done precise by looking into the image.

Second Embodiment

Figure 7:
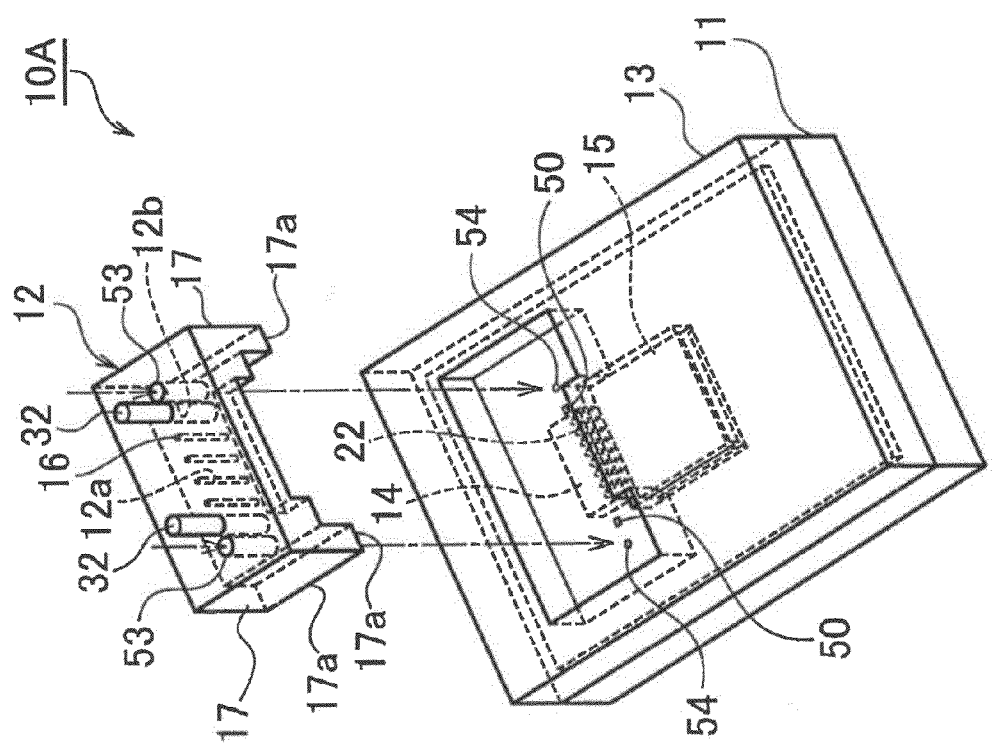
FIG. 7 is an illustrative diagram showing a positional relationship between through-holes and alignment marks for alignment in the optical module, according to the second embodiment of the invention.

In the following, an optical module according to a second embodiment of the invention will be described referring to FIGS. 7 and 8.

The optical module 10 according to the first embodiment of the invention uses two guide-pin holes 12b of the optical connector unit 12 in which the guide-pins 32 fit in as the through-holes for visually recognizing the alignment marks 50. In contrast, an optical module 10A according to the second embodiment of the invention shown in FIGS. 7 and 8 is provided with two alignment marks 54 in outer side of the alignment marks 50. Furthermore, holes 53 (hereinafter referred to as "through-holes for alignment") at outer side of the two guide-pin holes 12*b* in the optical connector unit 12 that have their center aligned with the center of the two guide-pin holes 12*b* are used as two through-holes for visually recognizing the two alignment marks 54. Other arrangement for the optical module 10A according to the second embodiment of the invention is similar with the optical module 10 according to the first embodiment of the invention.

According to the second embodiment of the invention arranged as such, the present invention accomplishes following functions and advantageous effects in addition to those of the first embodiment of the invention:

The through-holes for alignment 53 at outer side of the two guide-pin holes 12*b* that have their center aligned with the center of the two guide-pin holes 12*b* are used as two through-holes for visually recognizing the alignment marks 54 provided in outer side of the alignment marks 50. Consequently, under conditions wherein MT connectors are installed in the optical connector unit, provisional-positioning of the optical connector unit 12 can be accomplished through moving the optical connector unit 12 in two-dimension on the substrate 11 so that the alignment marks 54 are visually recognizable through the two through-holes for alignment 53 at the center of each through-hole 53. Therefore, active alignment to be carried out following the provisional-positioning can be achieved by passing light respectively through multi-core optical fibers held by the MT connector 30.

Third Embodiment

Figure 9A:
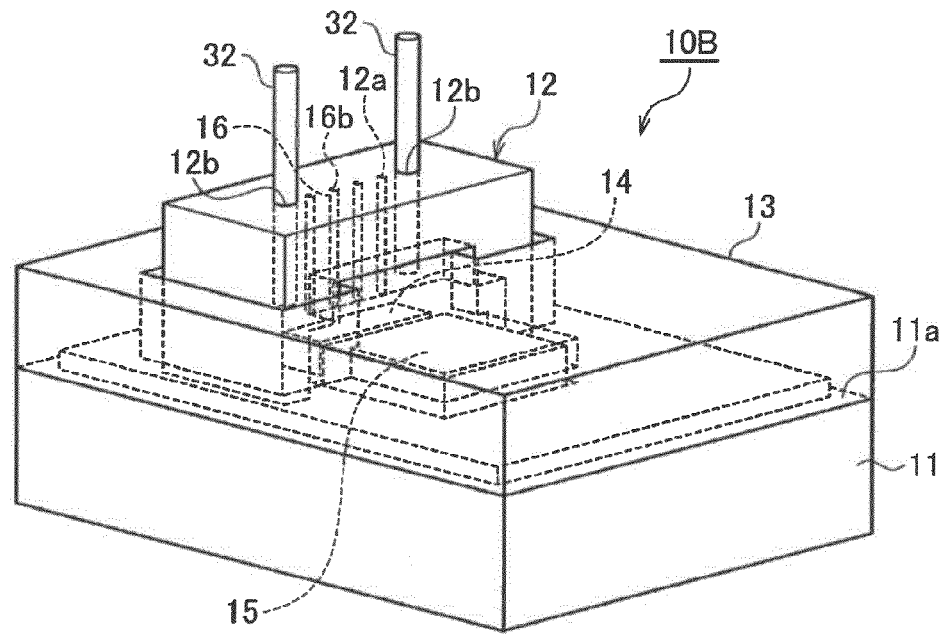
FIG. 9(A) is a perspective view showing an entire optical module according to the third embodiment of the invention.
Figure 9B:
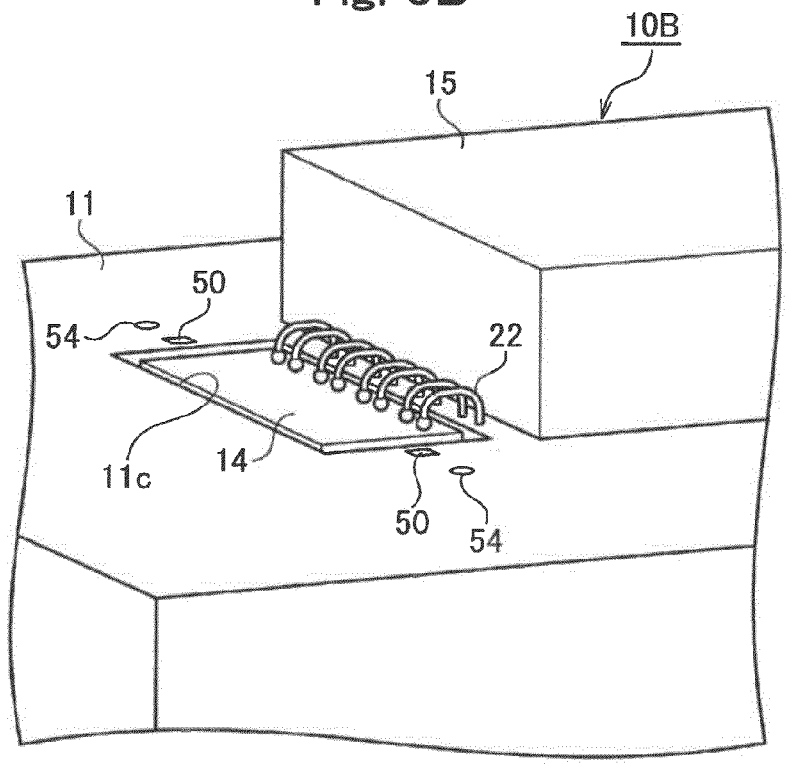
FIG. 9(B) is a perspective view showing main parts of the optical module.

An optical module according to the third embodiment of the invention will be described referring to FIGS. 9(A), 9(B) and 10.

In the above first embodiment of the invention, the driver IC 15 is implemented by wire bonding onto the electrode pattern of the substrate 11. In contrast, as shown in FIGS. 9(A), 9(B) and 10, the optical module 10B according to the third embodiment of the invention implements the driver IC 15 on the electrode pattern of the substrate 11 with flip chip implementation. Furthermore, in the optical module 10B, the laser diode array 14 is allocated in a recess region 11*c* provided in the substrate 11. Moreover, a plurality of surface emitting semiconductor laser element of the laser diode array 14 and a plurality of wiring in which the driver IC 15 is connected are respectively electrically connected via the wire 22. Other arrangement for the optical module 10B is similar with the optical module 10 according to the first embodiment of the invention.

In accordance with the optical module 10B according to the third embodiment of the invention arranged as such, in an optical module that implements the driver IC 15 on the electrode pattern of the substrate with flip chip implementation, the optical module 10 that is capable of performing active alignment within a short time and achieving reduction in number of parts and size.

The invention may be modified as in the following:
In the above embodiments of the invention, optical modules 10, 10A that are arranged as transmitter optical modules were described but the present invention is not limited to those. Alternatively, a photodiode array having a plurality of photodiode element (optical element) that is arranged in an array may be used instead of the laser diode array 14 in the optical modules 10, 10A. Furthermore, the present invention is applicable to optical modules arranged as a receiving optical module using an amplifying IC having a function of TIA (Transimpedance Amplifier) that amplifies output current of each photodiode by converting into voltage, instead of the driver IC 15.

Moreover, the present invention is applicable to optical modules implemented with a plurality of surface emitting semiconductor laser element (optical element) arranged in an array instead of the laser diode array 14, or to optical modules implemented with a plurality of photodiode (optical element) arranged in an array instead of the photodiode array.

What is claimed is:

1. An optical module comprising:
a substrate;
a plurality of optical elements disposed on said substrate;
an optical connector unit that holds a plurality of optical fibers and includes two guide-pin holes in which two guide pins fit in respectively, wherein said optical connector unit is disposed on a planar surface of said substrate in a location where said plurality of optical fibers and said plurality of optical elements are optically coupled; and
a cover including an opening for slidably attaching sidewalls of said optical connector unit to said substrate, wherein said cover covers said plurality of optical elements, wherein
two alignment marks are provided on said planar surface of said substrate, and the two alignment marks are visually recognizable through each of said two guide-pin holes, and
two guide-pins are respectively disposed in the two guide-pin holes, and an end of each of the two guide-pins protrude from a first surface of said optical connector unit that opposes a second surface of said optical connector unit that is in contact with said planar surface of said substrate.

2. The optical module according to claim 1, wherein said optical connector unit is configured to move two-dimensionally on said planar surface of said substrate to perform active alignment by adjusting a position of said optical connector unit so that each of said plurality of optical fibers and each of said plurality of optical elements are optically coupled.

3. The optical module according to claim 1, further comprising:
two through-holes for alignment having centers aligned with centers of said two guide-pin holes at outer sides of said two guide-pin holes.

4. The optical module according to claim 1, wherein a resin sealant or an adhesive agent is filled in a gap between an opening of said cover and said optical connector unit.

5. The optical module according to claim 1, comprising:
a plurality of surface emitting semiconductor laser elements as said optical element; and
a driver IC for driving said plurality of surface emitting semiconductor laser elements disposed on said substrate and electrically connected to said plurality of optical elements, wherein
said optical module is configured as a transmitting optical module that transmits an optical signal injected from said plurality of surface emitting semiconductor laser elements via said plurality of optical fibers in parallel.

6. The optical module according to claim 1, comprising:
a plurality of photodiodes as said optical element; and an amplifying IC that amplifies an output current of said plurality of photodiodes by converting said current into voltage, wherein said optical module is configured as a receiving optical module that receives at said plurality of photodiodes, an optical signal transmitted in parallel from outside via said plurality of optical fibers and converts to said optical signal to an electric signal.

7. The optical module according to claim 1, further comprising:

a second optical connector unit disposed on said optical connector unit, wherein said end of each of said two guide-pins protruding from said first surface of said optical connector unit fit into two through holes provided in said second optical connector unit.

8. The optical module according to claim 7, wherein the second optical connector unit is a multi-core ferrule type connector.

9. The optical module according to claim 1, wherein an end of each of said two guide-pins disposed in said two guide-pin holes are in contact with said planar surface of said substrate.

* * * * *